(12) United States Patent
Ray

(10) Patent No.: US 11,177,003 B1
(45) Date of Patent: Nov. 16, 2021

(54) SYSTEMS AND METHODS FOR RUNTIME ANALOG SANITATION OF MEMORY

(71) Applicant: Biswajit Ray, Madison, AL (US)

(72) Inventor: Biswajit Ray, Madison, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 16/809,191

(22) Filed: Mar. 4, 2020

Related U.S. Application Data

(60) Provisional application No. 62/813,494, filed on Mar. 4, 2019.

(51) Int. Cl.
| | | |
|---|---|---|
| *G11C 16/04* | (2006.01) | |
| *G11C 16/14* | (2006.01) | |
| *G11C 7/22* | (2006.01) | |
| *G11C 16/34* | (2006.01) | |
| *G11C 16/12* | (2006.01) | |

(52) U.S. Cl.
CPC ............ *G11C 16/14* (2013.01); *G11C 7/22* (2013.01); *G11C 16/12* (2013.01); *G11C 16/34* (2013.01)

(58) Field of Classification Search
CPC ..... G11C 16/10; G11C 11/5628; G11C 16/08; G11C 16/30; G11C 16/3418; G11C 16/0483; G11C 16/14; G11C 16/16; G11C 16/225; G11C 16/26; G11C 16/32; G11C 16/3431; G11C 16/3495; G11C 5/141; G11C 11/56; G11C 16/04; G11C 16/22; G11C 16/34; G11C 5/14

USPC ........ 711/103, 154, E12.002, 111, E12.008, 711/104, 105, 118, 173; 365/185.18, 365/185.24, 185.25, 185.29

See application file for complete search history.

(56) References Cited

U.S. PATENT DOCUMENTS

| | | |
|---|---|---|
| 5,321,241 A | 6/1994 | Craine |
| 5,652,803 A | 7/1997 | Tachikawa |
| 6,442,644 B1 | 8/2002 | Gustavson |
| 6,659,353 B1 | 12/2003 | Okamoto |
| 7,415,732 B2 | 8/2008 | Montecalvo |
| 8,572,440 B1 | 10/2013 | Nunally |
| 9,575,125 B1 | 2/2017 | Andre |
| 10,204,008 B2 | 2/2019 | Trezise |
| 10,223,199 B2 | 3/2019 | Hahn |
| 2007/0043667 A1 | 2/2007 | Qawami |
| 2007/0079387 A1 | 4/2007 | Montecalvo |

(Continued)

OTHER PUBLICATIONS

Guin, et al., "Counterfeit Integrated Circuits: A Rising Threat in the Global Semiconductor Supply Chain," Proceedings of the IEEE, Aug. 2014, pp. 1207-1228, vol. 102, No. 8.

(Continued)

*Primary Examiner* — Thong Q Le
(74) *Attorney, Agent, or Firm* — Maynard Cooper & Gale, P. C.; Jon E. Holland

(57) ABSTRACT

A memory system performs analog sanitization of memory using a partial programming operation to overwrite existing data taking into account the relative voltage levels in the memory cells. By taking into account the relative voltage levels, the timing of a partial programming operation can be controlled to provide matched voltage levels in the memory cells so that conventional computer forensic techniques for data recovery are ineffective.

16 Claims, 5 Drawing Sheets

(56) References Cited

U.S. PATENT DOCUMENTS

| | | | |
|---|---|---|---|
| 2008/0082872 A1 | 4/2008 | Nagasaka | |
| 2010/0125765 A1 | 5/2010 | Orbach | |
| 2012/0166814 A1 | 6/2012 | Hayashi | |
| 2014/0075051 A1 | 3/2014 | Zadesky et al. | |
| 2014/0143619 A1 | 5/2014 | Gorman | |
| 2016/0034217 A1* | 2/2016 | Kim | G06F 3/0679 711/103 |
| 2018/0158493 A1 | 6/2018 | Ryu | |
| 2020/0372967 A1 | 11/2020 | Rahman | |

OTHER PUBLICATIONS

Guin, et al., "Counterfeit IC Detection and Challenges Ahead," Jan. 2013, ACM SIGDA Newsletter, pp. 1-6.

Guo, et al., "FFD: A framework for Fake Flash Detection," Jun. 2017, ACM, pp. 1-6.

Wang, et al., Flash Memory for Ubiquitous Hardware Security Functions: True Random Number Generation and Device Fingerprints, 2012, IEEE, pp. 33-47.

Kumari, et al., Independent Detection of Recycled Flash Memory: Challenges and Solutions, 2018, IEEE, pp. 89-95.

Wei, et al., "Reliably Erasing Data from Flash-based Solid State Drives," Proceedings of the 9th USENIX Conferernce on File and Storage Technologies, 2011, pp. 1-13.

Lee, et al., "Secure Deletion for NAND Flash File Systems," ACM Symposium on Applied Computing, 2008, pp. 1710-1714.

Reardon, et al., "Data Node Encrypted File System: Efficient Secure Deletion for Flash Memory," 21st USENIX Security Symposium, 2012, pp. 333-348.

Reardon, et al., "On Secure Data Deletion," IEEE Symposium on Security and Privacy, vol. 12, No. 3, 2014, pp. 37-44.

Reardon, et al., "SoK: Secure Data Deletion," IEEE Symposium on Security and Privacy, 2013, pp. 305-315.

Cai, et al., "Program Interference in MLC NAND Flash Memory: Characterization, Modeling, and Mitigation" IEEE 31st International Conference on Computer Design, 2013, pp. 123-130.

"Understanding Flash: The Flash Translation Layer," flashdba, 2014.

Cai, et al., "Error Characterization, Mitigation, and Recovery in Flash-Memory-Based Solid-State Drives," IEEE, vol. 105, No. 9, 2017, pp. 1666-1704.

Grupp, et al., "Characterizing Flash Memory: Anomalies, Observations, and Applications," 2009 42nd Annual IEEE/ACM International Symposium on Micro Architecture, 2009, pp. 24-33.

Luo, et al., "Enabling Accurate and Practical Online Flash Channel Modeling for Modern MLC NAND Flash Memory," IEEE J. SEI. Areas Communication, vol. 34, No. 9, 2016, pp. 2294-2311.

Cai, et al., "Threshold Voltage Distribution in MLC NAND Flash Memory: Characterization, Analysis, and Modeling," 2013 Design, Automation Test in Europe Conference Exhibition, 2013, pp. 1285-1290.

Gutmann, et al., "Data Remanence in Semiconductor Devices," USENIX Security Symposium, 2001.

Gutmann, et al., "Secure Deletion of Data from Magnetic and Solid-State Memory," USENIX Security Symposium, Focusing on Applications of Cryptography, vol. 6, 1996, pp. 1-17.

Skorobogatov, Data Remanence in Flash Memory Devices, Proceedings of the 7th International Conference on Cryptographic Hardware and Embedded Systems, 2005, pp. 339-353.

Biswajit Ray, U.S. Appl. No. 17/207,260, entitled, Systems and Methods for Runtime Analog Sanitation of Memory, filed Mar. 19, 2021.

Ray, et al., U.S. Appl. No. 16/219,586, entitled, Systems and Methods for Detecting Counterfeit Memory, filed Dec. 13, 2018.

* cited by examiner

SYSTEMS AND METHODS FOR RUNTIME ANALOG SANITATION OF MEMORY

CROSS REFERENCE TO RELATED APPLICATION

This application claims priority to U.S. Provisional Patent Application No. 62/813,494, entitled "Data Recovery from 'Scrubbed' NAND Flash Storage: Need for Analog Sanitization," and filed on Mar. 4, 2019, which is incorporated herein by reference.

RELATED ART

Memory is an important element in a variety of electronic and computer applications. Memory may include volatile and nonvolatile memory. Volatile memory usually loses the data stored therein with a loss of power. Nonvolatile memory can preserve information even after power cycling.

Nonvolatile memory provides a great number of useful purposes, but can become a security concern when it comes time to disposal of data or disposal of the memory system itself. Many second-hand nonvolatile memory systems have been found to contain sensitive and confidential information about businesses, individuals, and government interests after being sold to third parties. Even memory systems thought to have been erased have been found to have sensitive and confidential information recoverable on them.

NAND flash memory is generally a very popular commercial nonvolatile memory (NVM) option due to its high density (greater than 1 terabyte (TB)/square inch) along with its relatively low cost (less than \$1/gigabyte (GB)), light-weight and low power consumption, making it very attractive for a variety of electronic systems. Previously it had been thought that deleting files from flash drives was sufficient to remove sensitive and confidential information from them. However, when performing a deletion operation, many memory systems mark memory pages as unavailable without actually removing or overwriting delete the data.

Some memory system provide greater security by forcing a program operation on the cells of flash memory during a deletion. However, using various computer forensics techniques, old data may still be recoverable from overwritten flash memory areas. It would be useful to provide a methodology for deleting data from flash memory and other types of memory in a manner that prevents recovery of the deleted data with conventional computer forensic techniques. It would be desirable for such methodology to be low cost and compatible with existing memory systems.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for performing analog memory sanitization (secure data deletion) of memory systems or a portion thereof. Simple overwriting of data is not always sufficient for secure and permanent deletion of data from memory. For example, in certain types of memory, such as flash memory, an older zero (i.e., a bit value of zero previously programmed into a memory cell longer ago) has a different analog voltage strength in the memory cell than a newer zeros (i.e., a bit value of zero programmed into a memory cell more recently). These differences in charge strength can lead to recoverable data even after the data the memory cells have been overwritten. To more effectively sanitize the data from flash memory to prevent such data recovery, a partial programming operation can be used to overwrite existing data taking into account the relative voltage levels in the memory cells. By taking into account the relative voltage levels, the timing of a partial programming operation can be controlled to provide matched voltage levels in the memory cells so that conventional computer forensic techniques for data recovery are ineffective.

Figure 1:
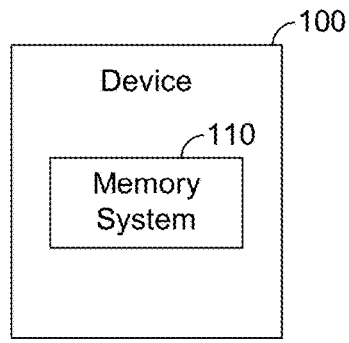
FIG. 1 is a block diagram illustrating an exemplary device with a flash memory.

FIG. 1 is a block diagram illustrating an exemplary device with 100 a memory system 110 for storing data. The device 100 may include, but is not limited to, smartphones, mobile devices, tablets, personal digital assistants, personal computers, game consoles, game cartridges, or other devices, and the memory system 110 may be a memory card, a Universal Serial Bus flash drive, a solid-state drive or other types of memory. In an exemplary embodiment, the memory 110 may be a NAND flash architecture, although in other embodiments other types of devices 100 and other types of memory 110 may be possible.

Figure 2:
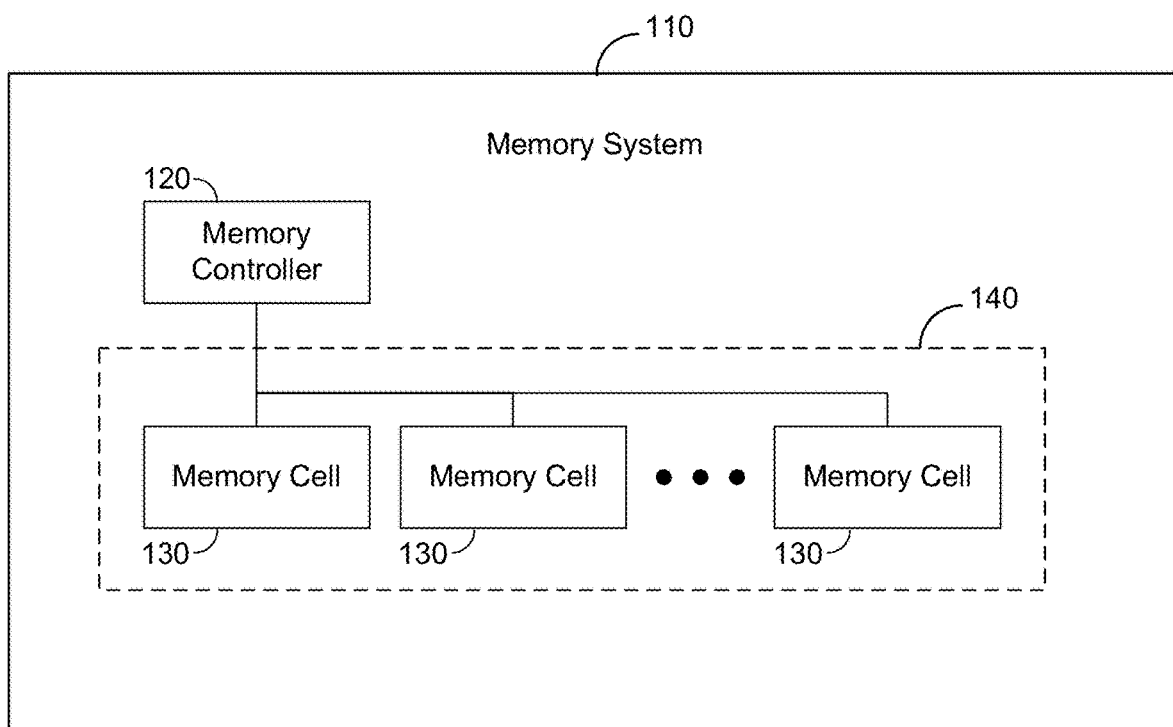
FIG. 2 is a block diagram illustrating an exemplary embodiment of a memory system.

FIG. 2 depicts a memory system 110 having a plurality of memory cells 130. In actuality, the memory system 110 may have any number of memory cells (e.g., from one to a trillion or more), but in FIG. 2 a few memory cells 130 are shown for simplicity of description. The memory cells 130 may be flash memory configured as NOR, NAND, VNAND or other types or arrangements. Unless otherwise indicated, it will be assumed that the memory cells shown by FIG. 2 and described herein are NAND flash memory cells, but it should be emphasized that other types of memory cells are possible (NOR flash, Resistive RAM, Ferroelectric RAM, etc.). In addition, each cell 130 of the memory system 110 may be configured for storing a desired number of charge states (e.g., bits) per cell, such as single level cell (SLC), multi-level cell (MLC), triple-level cell (TLC) or otherwise. The memory cells 130 can be located on one or more memory chips 140. Within some classes of memory chips 140, memory cells are setup in blocks and pages. A page represents the smallest unit that can be programmed to a memory chip 140. A block represents the smallest unit that can be erased from a memory chip 140. In some embodiments, there are multiple pages within each block. Note that, in the context of memory operations, the terms "program" and "write" are synonymous, and these terms shall be used interchangeably herein.

As shown by FIG. 2, the memory cells 130 may be coupled to a memory controller 120 that is configured to perform memory operations, such as reading, erasing, and programming (i.e., writing) on the memory cells 130 similar to other memory controllers known in the art. The memory controller 120 may be implemented in hardware or a combination of hardware and software. As an example, the memory controller 120 may be implemented exclusively in hardware, such as an ASIC, a field programmable gate array, or other type of circuitry configured to perform memory operations. In another example, the memory controller 120 may comprise a processor, such as digital signal processor (DSP) or central processing unit (CPU), that is configured to execute software to perform one or more function of the memory controller 120. The memory controller 120 may also comprise a clock (not shown) for enabling the memory controller 120 to track or otherwise determine time.

As known in the art, memory operations may be performed by applying specific voltages on connections or "lines," such as word lines and bit lines, connected to one or more memory cells 130 as appropriate for performing the desired operation. In some embodiments, memory cells 130 may be located on one or more memory chips 140 (i.e., an integrated circuit chip with memory), and the memory controller 120 may be on a separate integrated circuit (IC) chip that is electrically coupled to the memory chip 140. The memory controller 120 may transmit to a memory chip 140 a request to perform a memory operation, and the memory chip 140 may perform the requested operation applying voltages as appropriate to the memory cells 130 of the memory chip 140.

Figure 3:
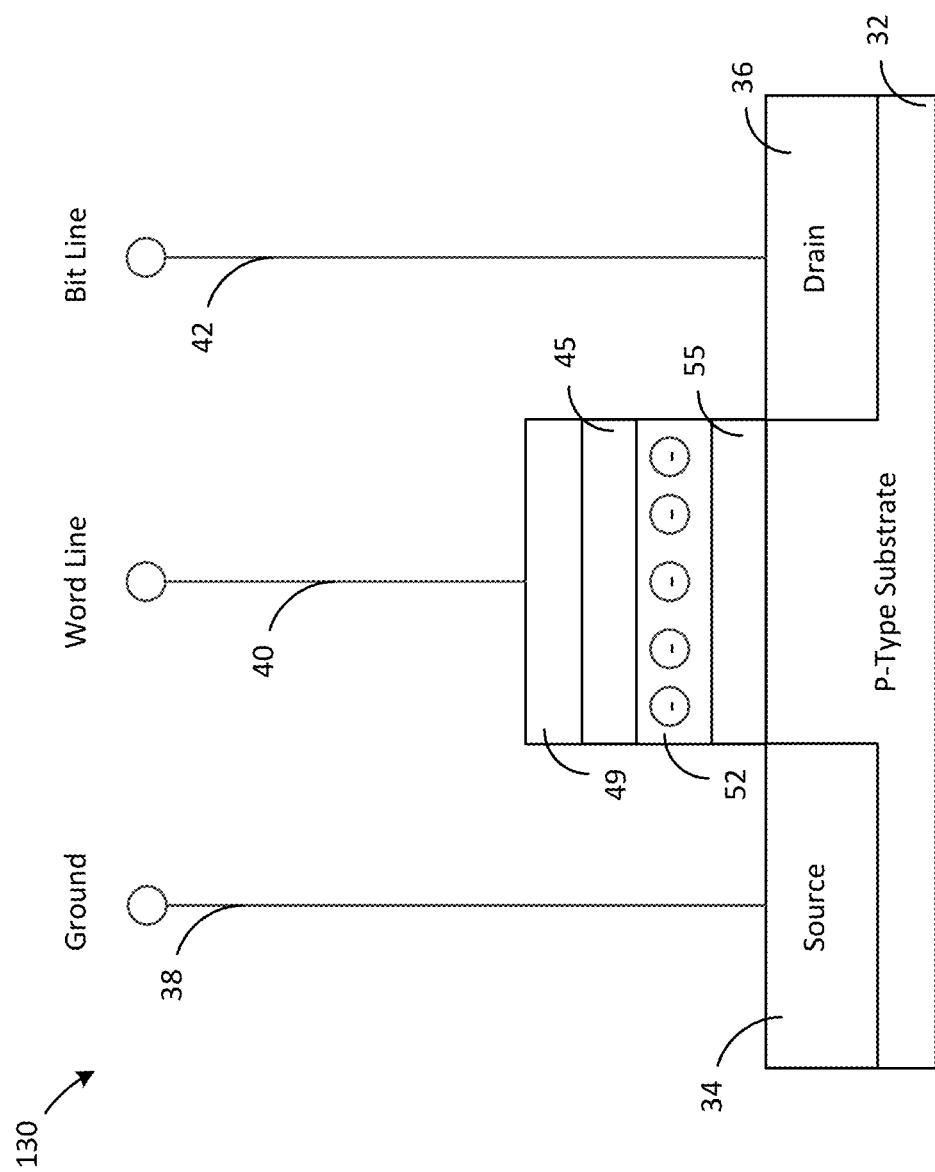
FIG. 3 is a block diagram illustrating an exemplary embodiment of a flash memory cell, such as is depicted by FIG. 2.

Flash memory is generally a type of non-volatile semiconductor memory that stores information in the form of charge on one or more floating gates 52. FIG. 3 depicts an exemplary embodiment of a flash memory cell 130, such as is depicted by FIG. 2. The memory cell 130 of FIG. 2 is depicted as essentially a standard flash memory cell and has a substrate 32, source 34, drain 36, ground line 38, word line 40, and bit line 42. The memory cell 130 has a blocking oxide 45 below the control gate 49 and tunnel oxide 55 below the floating gate 52. Voltage may be applied to the cell 130 via the lines 38, 40, 42 to perform read/erase/program operations. Structurally, a flash memory cell 130 comprises a floating gate metal-oxide-semiconductor field effect transistor (FG-MOSFET) 52, which allows electrons from the silicon substrate 32 to be tunneled into the floating gate 52 during the program operation (e.g., by applying a large positive charge differential across the control gate 49 and the substrate 32). The erasure operation uses tunneling to remove electrons from the floating gate 52 to the substrate 32 (e.g., by applying a large negative charge differential across the control gate 49 and the substrate 32).

Figure 4:
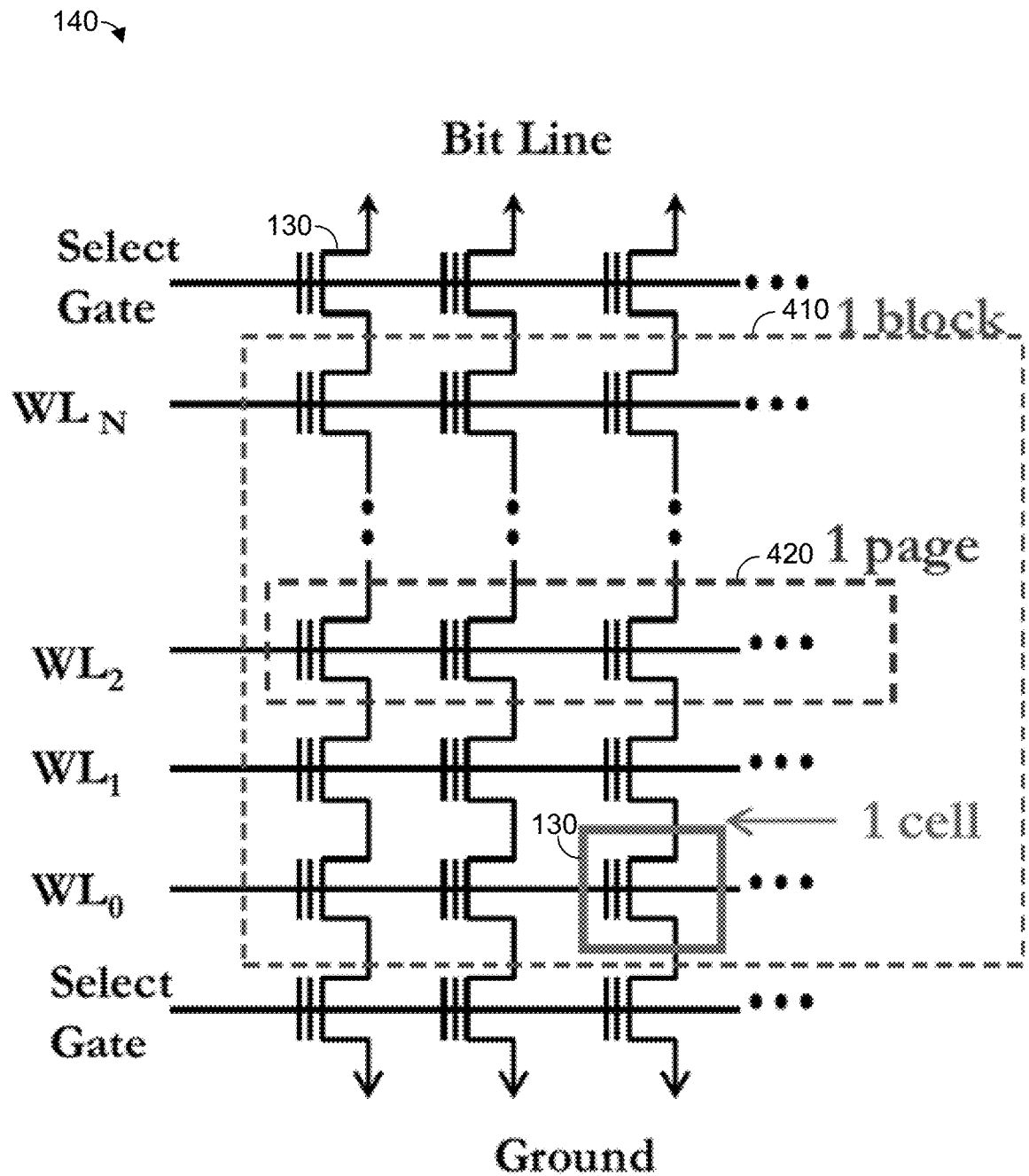
FIG. 4 is a diagram illustrating an exemplary NAND flash memory array of a memory chip depicted in FIG. 2 using cells depicted in FIG. 3.

FIG. 3 depicts a memory cell 130 of a memory chip 140, and FIG. 4 depicts an exemplary NAND flash memory array of memory cells 130. Flash memory chips 140 are generally arranged in one or more blocks 410. Each block 410 generally contains one or more pages 420 (e.g., a block may contain 32 pages). Each page generally holds one or more memory cells 130 representing bits (e.g., a page may contain 512 to 16 K memory cells plus additional cells for error correction). The values stored in memory cells 130 are changed through operations generally referred to as erasing and programming.

The erase operation in NAND flash typically involves setting a high voltage on the substrate 32 and a low voltage on all the control gates 49 of the block 410 causing electron tunneling from the floating gate 52. An erase operation often forces the bit value in a memory cell 130 to a logical high value (e.g., a "1"). Performance of the erase operation typically erases each memory cell 130 of the block being erased.

The program operation in NAND flash typically involves setting a high voltage on selected control gates 49 of the memory cells 130 of the page to be programmed and a low voltage on the substrate 32. This voltage differential causes electron tunneling to the floating gate 52 of the memory cells 130 to be programmed and not the other memory cells 130 of the page. Controlling the voltage on selected bit lines 42 and word lines 40 affects which page and memory cells 130 of a page 420 are programed. A program operation often forces the bit value in a memory cell 130 being programmed to a logical low value (e.g., a "0"). During the programing operation, only the set of memory cells 130 to which a high gate voltage is applied are forced to the logical low bit value (e.g., from one "1" to zero "0"), and the values in the remaining memory cells 130 remain unchanged.

Generally, a block 410 is not erased every time a page it contains is deleted. Instead, the deleted pages are marked as invalid page addresses. Some conventional memory controllers may attempt to overwrite data to be deleted in an effort to remove the data from the memory chip. In this regard, a memory controller may erase cells that are storing a logical high bit value by programming them to a logical low bit value so that all of the memory cells storing the deleted data should be at a logical low value. Even though each cell is at a logical low bit value, the analog voltage level in the cells may be different depending on when each respective cell was programmed to a logical low value (e.g., a "0").

In this regard, the charge stored on the floating gates 52 of programmed flash memory cells 130 experience voltage leakage over time. As a result, the memory cells storing the zero bits (i.e., logical low bit values) in the original data lose a portion of the stored charge over time giving it a lower threshold voltage Vt. These older zero bits associated with more charge loss shall be referred to hereafter as "weak zeros" or "weak 0's." Newer zero bits associated with less charge loss due to more recent programming shall be referred to hereafter as "strong zeros" or "strong 0's."

Figure 5:
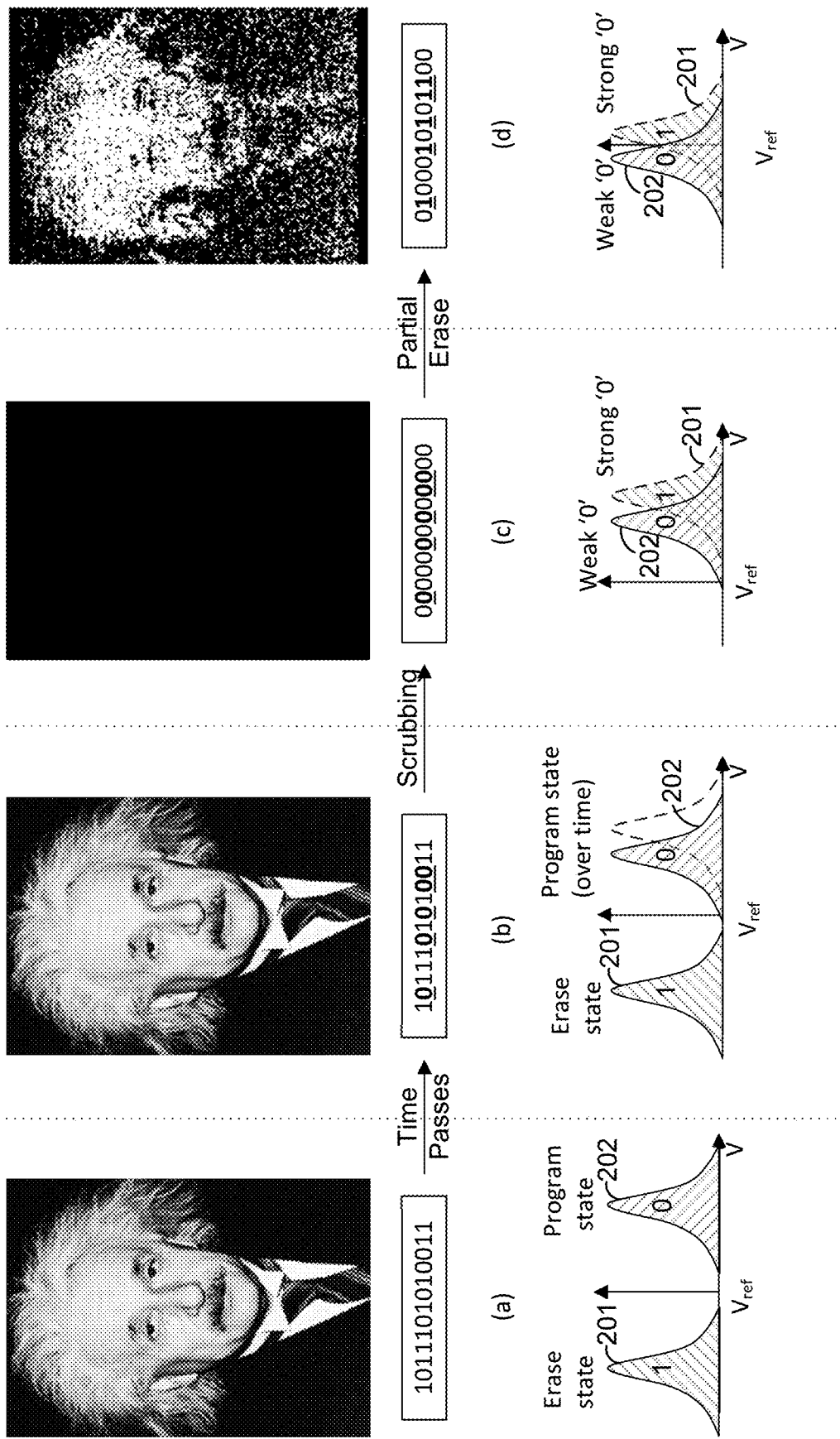
FIG. 5 is illustrates an process of data recovery from a scrubbed flash memory as depicted by FIG. 4.

FIG. 5a shows a voltage distribution for charge levels in memory cells storing data, such as data defining an image of Einstein. Some of the memory cells are in an erase state and store a logical high value (e.g., a binary "1"). The other cells are in a program state and store a logical low value (e.g., a binary "0"). The curve 201 in FIG. 5a represents the voltage distribution for the memory cells in the erase state, and the curve 202 in FIG. 5a represents the voltage distribution for the memory cells in the program state. The vertical axis in FIG. 5a-d may represent the number of memory cells at the corresponding voltage level. $V_{ref}$ refers to the reference voltage applied to the memory cells 130 for comparison to the stored charge levels to determine whether a binary "1" or "0" is stored in the cell. Since the voltage levels for the memory cells 130 in the erase state (i.e., represented by curve 201) are lower than $V_{ref}$, the bit values read from these memory cells should be a binary "1." Since the voltage levels for the memory cells 130 in the program state (i.e., represented by curve 202) are greater than $V_{ref}$, the bit values read from these memory cells 130 should be a binary "0."

Over time, charge leakage slightly lowers the voltage levels (i.e., the amounts of charge) in the memory cells 130 represented by curve 202, as shown by FIG. 5b. Thus, the curve 202 shifts slightly to the left along the horizontal axis, as shown by FIG. 5b, indicating that each memory cell 130 in the program state stores less charge than at the time that the memory cell 130 was first programmed with a logical low value.

At some point, the image may be deleted, and this deletion may be performed by overwriting the memory cells 130 represented by curve 201 with a logical low value so that all memory cells 130 (i.e., those represented by curve 201 and those represented by curve 202) store a bit value of "0," as shown by FIG. 5c. However, the memory cells 130 represented by curve 201 have been newly programmed and thus have greater voltage levels than the memory cells 130 represented by curve 202, which have been affected by charge leakage. The bit values in the memory cells 130 represented by curve 201 are "strong zeros" since they are at higher analog voltages than the bit values in the memory cells 130 represented by curve 202. These bit values in the memory cells 130 represented by curve 202 are "weak zeros" since they are at lower voltages due to charge leakage that has occurred since these memory cells 130 were last programmed.

The voltage difference between the weak zeros and the strong zeros may be used to recover the original data defining the image even though this data has been deleted by programming the memory cells 130 represented by curve 201. As an example, $V_{ref}$ may be changed such that it is between the peaks of the curves 201 and 202, as shown by FIG. 5d. By so adjusting the reference voltage, the weak zeros may be distinguished from the strong zeros using normal read operations so that the deleted data is recoverable. In such an example, the restored data may be an inverse of the original data that can be corrected through a bit inverse operation.

In other examples, the data may be recovered without adjusting the reference voltage. As an example, a partial erase operation may be performed to reduce the voltages of curves 201 and 202 so that $V_{ref}$ is substantially between the curves 201 and 202, similar to FIG. 5d. In such example, similar techniques may be used to read the memory cells 130 and recover the originally stored data that has been deleted.

In some embodiments, the memory system 110 is configured to overwrite data in a manner that prevents the data from being successfully recovered using the aforementioned data restoration techniques. In this regard, when the memory controller 120 performs a memory operation for writing data to group of memory cells 130, such as in response to request to delete or erase data previously stored in the memory cells 130, the memory controller 120 is configured to perform the write operation so that the analog voltage levels in all of the memory cells 130 substantially match once the write operation is complete. Note that the use of "substantially" is a recognition that the voltage levels do not need to precisely match and some differences in the voltage levels are acceptable as long as the differences are small enough to prevent data previously stored in the memory cells prior to the write operation from being successfully restored.

In order to ensure that the voltage levels in the memory cells 130 substantially match after performance of the write operation, the memory controller 120 is configured to determine a value that is indicative of the amount of voltage leakage that has occurred in the memory cells 130 that are not affected by the write operation. As an example, as described above, when data in a memory chip 140 is to be deleted, some of the data corresponds to logical low values (e.g., 0's), and the memory cells 130 storing these 0's shall be referred to hereafter as "weak zero cells." The remaining data corresponds to logical high values (e.g., 1's), and the memory cells storing these 1's shall be referred to hereafter as "strong zero cells." In FIG. 5a, the voltage distribution of the weak zero cells 130 may be represented by curve 202, and the voltage distribution of the strong zero cells 130 may be represented by curve 201 (noting that the data value in the strong zero cells 130 is actually a logical high value (e.g., 1) prior to the write operation). In this example, the charge levels in the weak zero cells 130 corresponding to curve 202 are not affected by the write operation. Thus, in performing the write operation, the memory controller 120 is configured to determine a value, referred to hereafter as leakage value, indicative of the amount of voltage or charge leakage that has occurred in these weak zero cells 130 since these cells 130 were last programmed with a bit value of 0. Based on this value, the memory controller 120 is configured to control the write operation such that the voltage levels in the strong zero cells 130 being programmed by the write operation substantially match the voltage levels in the weak zero cells 130, as will be described in more detail below.

There are various techniques that may be used to determine the leakage value. In some embodiments, the leakage value is a time value that indicates the amount of time that has elapsed since the weak zero cells 130 were last programmed. In this regard, the amount of voltage leakage is generally proportional to the amount of time that has elapsed since programming, and such a time value thus indicates an amount of leakage loss that has occurred to the charge levels in the weak zero cells 130.

To enable the memory controller 120 to determine such a leakage value, the memory controller 120 (at the time of programming the weak zero cells 130 corresponding to curve 202 with a bit value of 0 in a previous write operation) is configured to store in memory (e.g., one or more registers or other forms of memory) information indicative of the time of performance of such previous write operation. As an example, such information may be a timestamp indicating an approximate time that this previous write operation occurred. When the memory controller 120 performs the current write operation on the strong zero memory cells 130 corresponding to curve 201 in order to delete or erase the data stored in the memory cells 130, the memory controller 120 is configured to retrieve the time information associated with the previous write operation and compare (e.g., subtract) it to the current time to determine the leakage value, which indicates the amount of time that has elapsed since the previous write operation and thus the amount of voltage or charge that has leaked from the weak zero cells 130. The memory controller 120 then uses this leakage value to control the current write operation such that the analog voltage levels in the strong zero memory cells 130 substantially match the analog voltage levels in the weak zero memory cells 130. This process of substantially matching such voltage levels is referred to as "analog sanitization" as it sanitizes the memory system 110 of the data being overwritten at the analog or voltage level within the memory system 110 such that the data cannot be restored from the voltage levels in the memory cells 130.

There are various techniques that the memory controller 120 can use to ensure that voltage levels in the strong zero cells 130 and the weak zero cell 130 substantially match after performance of the current write operation. In some embodiments, the memory controller 120 performs a partial write operation rather than a full write operation and controls the timing of the partial write operation such that it ends when the voltages in the strong zero memory cells 130 substantially match the voltages in the weak zero memory cells 130.

In this regard, a full write operation takes a finite amount of time. As a full write operation is performed on the strong zero cells 130 corresponding to the curve 201, the voltage in the strong zero cells 130 is increased such that the curve 201 begins moving to the right along the horizontal axis in FIG. 5*a*. If the full write operation is allowed to run to completion, then the curve 201 would effectively move past the curve 202 representative of the weak zero cells 130, noting that this curve 202 has move slightly to the left along the horizontal axis over time due to charge leakage. In this regard, if the full write operation is allowed to progress to completion, then there would be voltage difference between the weak zero cells 130 and the strong zero cells 130, as indicated by FIG. 5*c*. and described above. However, in the instant embodiment, the memory controller 120 does not allow the write operation to fully complete but rather performs a partial write operation such that the operation terminates before the strong value cells 130 are fully charged. Specifically, the timing of the write operation is controlled such that the partial write operation is terminated when the peak of the curve 201 substantially matches the peak of the curve 202 so that there is not a significant voltage difference between the weak zero cells 130 and the strong zero cells 130.

To perform the partial write operation, the memory controller 120 may transmit a program request for requesting the memory chip 140 to write a zero bit value in the strong zero cells 130, as the memory controller 120 would do for a full write operation. In response, the memory chip 140 applies voltages to the strong zero memory cells 130 so that the charge levels in these cells 130 begin to increase. However, before the write operation is fully completed, the memory controller 120 sends another request to the memory chip 140 for stopping or interrupting the write operation being performed. As an example, the memory controller 120 may send a conventional reset request, which causes a reset at the memory chip 140 thereby stopping the memory chip 140 from continuing with the write operation. In other embodiments, other types of requests may be sent by the memory controller 140 to stop the write operation.

Based on the leakage value, the memory controller 120 determines when to send the reset request (or other request for stopping the write operation) so that the write operation is stopped when the voltage levels in the strong zero memory cells 130 have approximately reached the voltage levels in the weak zero memory cells 130. In this regard, the timing of the reset request is inversely proportional to the leakage value. That is, for a larger leakage value (indicating that a greater amount of time has elapsed since programming of the weak zero cells 130 and, thus, indicating a greater amount of leakage loss), the memory controller 120 waits less time since initiation of the current write operation before sending the request to stop the current write operation. Conversely, for a smaller leakage value (indicating that a less amount of time has elapsed since programming of the weak zero cells 130 and, thus, indicating a smaller amount of leakage loss), the memory controller 120 waits more time since initiation of the current write operation before sending the request to stop the current write operation. In any event, the timing of the reset request (or other request for stopping the current write operation) is controlled based on the leakage value so that the current write operation is stopped once the voltage levels in the strong zero cells 130 being programmed substantially match the voltage levels in the weak zero cells 130 that are unaffected by the current write operation.

Figure 6:
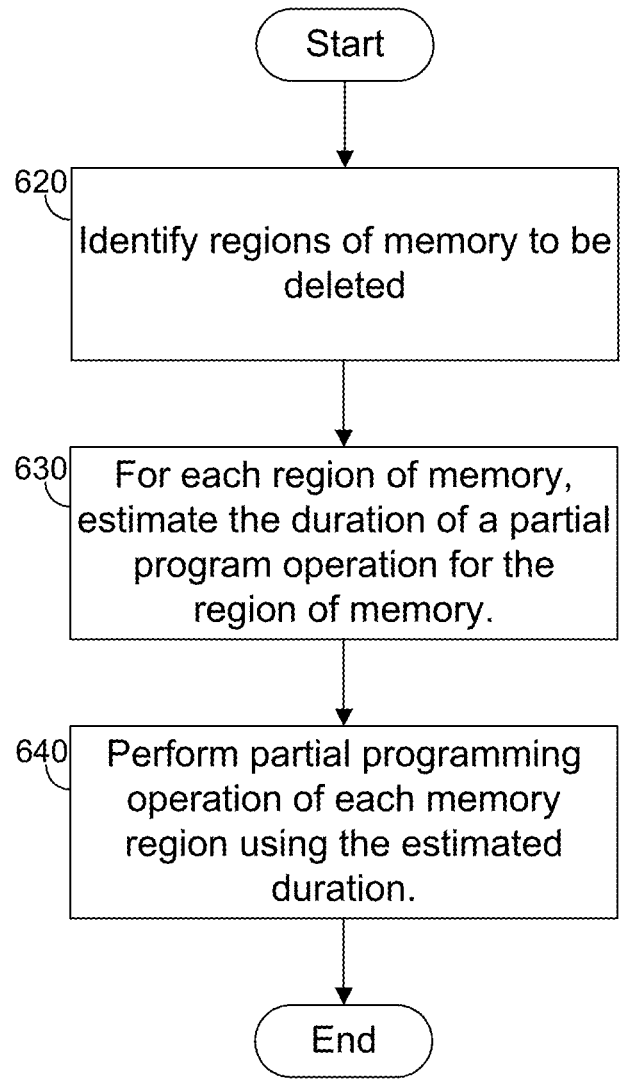
FIG. 6 is flowchart illustrating an exemplary process of analog scrubbing of a flash memory, such as is depicted by FIG. 4.

To better illustrate the foregoing, an exemplary use of the memory system 110 to delete stored data will be described with particular reference to FIG. 6. At step 620, the memory controller 120 identifies the memory regions affected by a requested deletion operation (e.g., identifying a set of physical pages affected). In some embodiments, this identification is performed by receiving a list of affected memory locations (e.g., pages). In some embodiments, this identification involves looking up logical or physical locations from file system records of files to be deleted and calculating the memory locations affected. At step 630, for each memory region to be deleted, the memory controller 120 estimates the duration of the partial programing operation needed to sanitize the region (e.g., how long it would take for a partial programming operation to change existing ones 1's to zeros 0's to the voltage levels of existing zeros 0's for that memory region). In some embodiments, this involves identifying or estimating the age of existing data stored in the region to be deleted (e.g., the existing zeros 0's). As described above, this age can be calculated by comparing the current time to the time that the existing data was previously written to the memory chip 140.

At step 640, the memory controller 120 performs a partial programing of each of the identified memory regions for the estimated duration for the respective region. In some embodiments, a partial program operation is performed by issuing a normal programming operation followed by a reset or disrupt request before the program operation has been completed to shorten the program operation to the estimated duration for the particular memory region. In some embodiments, a partial program operation may be performed by issuing a program request along with a program time specifying a shortened time to perform the requested program operation.

The data sanitizing systems and methods described above may be used in the context of sanitizing NAND flash memory or other types of memory that allow for partial programming operations. In some embodiments and memory technologies, partial erase and program operations may be swapped to perform similar functions.

The foregoing is merely illustrative of the principles of this disclosure and various modifications may be made by those skilled in the art without departing from the scope of this disclosure. The above-described embodiments are presented for purposes of illustration and not of limitation. The present disclosure also can take many forms other than those explicitly described herein. For instance, the order of particular steps or the form of particular processes can be changed in some cases to perform equivalent steps. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

Now, therefore, the following is claimed:

1. A memory system, comprising:
    memory having a plurality of memory cells; and
    a memory controller configured to perform a first program operation for writing data to the plurality of memory cells and to store a first time value specifying a time associated with the first program operation, the memory controller further configured to perform a second program operation for deleting the data from the plurality of memory cells, wherein the memory controller is configured to control a duration of the second program operation based on the first time value.

2. The memory system of claim 1, wherein the memory resides in an integrated circuit (IC) chip, and wherein the memory controller is configured to perform the second program operation by (1) transmitting to the IC chip a program request for instructing the IC chip to write a bit value to the plurality of memory cells, (2) transmitting to the IC chip a request for interrupting writing of the bit value to the plurality of memory cells, and (3) controlling a timing of the request for interrupting the writing of the bit value based on the first time value.

3. The memory system of claim 1, wherein the memory controller is configured to compare the first time value to a second time value and to control the duration of the second program operation based on a comparison of the first time value to the second time value.

4. A memory system, comprising:
    memory having a first plurality of memory cells and a second plurality of memory cells; and
    a memory controller configured to perform a first program operation for writing data to the first plurality of memory cells and the second plurality of memory cells, the memory controller further configured to store a time value indicative of a time associated with the first program operation and to perform a second program operation for deleting the data from the memory, wherein the memory controller is configured to control a duration of the second program operation based on the time value, wherein the first program operation writes a first bit value to the first plurality of memory cells and a second bit value to the second plurality of memory cells, wherein the memory controller is configured to calculate a value indicative of an amount of voltage leakage in the first plurality of memory cells based on the time value, and wherein the memory controller is configured to control duration of the second program operation based on the value indicative of the amount of voltage leakage such that analog voltages in the second plurality of memory cells substantially match analog voltages in the first plurality of memory cells.

5. The memory system of claim 1, wherein the memory is flash memory.

6. A memory system, comprising:
    memory having memory cells; and
    a memory controller configured to perform a first program operation for writing data to the memory cells such that a first plurality of the memory cells store a first bit value of the data and a second plurality of the memory cells store a second bit value of the data, the memory controller further configured to perform a second program operation for deleting the data from the memory, wherein the memory controller is configured to determine a value indicative of an amount of voltage leakage associated with the first plurality of the memory cells, the memory controller further configured to control a duration of the second program operation based on the value such that analog voltages in the second plurality of the memory cells substantially match analog voltages in the first plurality of the memory cells.

7. The memory system of claim 6, wherein the memory controller is configured to store a time value indicative of a time associated with the first program operation, and wherein the memory controller is configured to determine the value indicative of the amount of voltage leakage based on the time value.

8. The memory system of claim 6, wherein the memory is flash memory.

9. A memory system, comprising:
    memory having memory cells, including a first plurality of the memory cells storing a first bit value and a second plurality of the memory cells storing a second bit value; and
    a memory controller configured to perform analog sanitization of the memory, including the first plurality of the memory cells and the second plurality of the memory cells, using a partial programming operation for affecting the first bit value stored in the first plurality of the memory cells, the memory controller configured to estimate a duration of the partial programming operation to ensure that analog voltages of the first plurality of the memory cells substantially match analog voltages of the second plurality of the memory cells, wherein the memory controller is configured to perform the partial programming operation using the estimated duration.

10. The memory system of claim 9, wherein the estimated duration is based on the age of the second bit value stored in the second plurality of the memory cells.

11. The memory system of claim 9, wherein the memory is flash memory.

12. A method, comprising:
    performing a first program operation for writing data to a plurality of memory cells;
    storing in memory a first time value specifying a time associated with the first program operation;
    performing a second program operation for deleting the data from the plurality of memory cells;
    retrieving the first time value from the memory; and
    controlling a duration of the second program operation based on the first time value.

13. The method of claim 12, wherein the plurality of memory cells reside in an integrated circuit (IC) chip, and wherein the second program operation is performed by:
    transmitting to the IC chip a program request for instructing the IC chip to write a bit value to the plurality of memory cells;
    transmitting to the IC chip a request for interrupting writing of the bit value to the plurality of memory cells; and
    controlling a timing of the request for interrupting the writing of the bit value based on the first time value.

14. The method of claim 12, further comprising comparing the first time value to a second time value, wherein the controlling is based on the comparing.

15. The method of claim 12, wherein the plurality of memory cells are flash memory cells.

16. A method, comprising:
    performing a first program operation for writing data to memory including a first plurality of memory cells and a second plurality of memory cells, wherein the first program operation writes a first bit value to the first plurality of memory cells and a second bit value to the second plurality of memory cells;
storing in memory a time value indicative of a time associated with the first program operation;
performing a second program operation for deleting the data from the memory;
retrieving the time value from the memory;
calculating a value indicative of an amount of voltage leakage in the first plurality of memory cells based on the time value; and
controlling a duration of the second program operation based on the time value, wherein the controlling is based on the value indicative of the amount of voltage leakage such that analog voltages in the second plurality of cells substantially match analog voltages in the first plurality of cells.

* * * * *